(12) United States Patent
Ikuta et al.

(10) Patent No.: US 8,710,489 B2
(45) Date of Patent: Apr. 29, 2014

(54) EPITAXIAL SUBSTRATE FOR ELECTRONIC DEVICE, IN WHICH CURRENT FLOWS IN LATERAL DIRECTION AND METHOD OF PRODUCING THE SAME

(75) Inventors: Tetsuya Ikuta, Tokyo (JP); Daisuke Hino, Tokyo (JP); Ryo Sakamoto, Tokyo (JP); Tomohiko Shibata, Tokyo (JP)

(73) Assignee: Dowa Electronics Materials Co., Ltd., Tokyo (JP)

( * ) Notice: Subject to any disclaimer, the term of this patent is extended or adjusted under 35 U.S.C. 154(b) by 0 days.

(21) Appl. No.: 13/384,006

(22) PCT Filed: Jul. 13, 2010

(86) PCT No.: PCT/JP2010/004539
§ 371 (c)(1),
(2), (4) Date: Feb. 28, 2012

(87) PCT Pub. No.: WO2011/007555
PCT Pub. Date: Jan. 20, 2011

(65) Prior Publication Data
US 2012/0168719 A1 Jul. 5, 2012

(30) Foreign Application Priority Data
Jul. 17, 2009 (JP) .................... 2009-169349

(51) Int. Cl.
*H01L 29/06* (2006.01)
*H01L 31/00* (2006.01)

(52) U.S. Cl.
USPC .................. 257/15; 438/14; 257/20; 257/24; 257/183; 257/190; 257/E21.53; 257/9; 257/12; 257/14; 257/18; 257/E29.024

(58) Field of Classification Search
USPC .............................................. 257/15; 438/38
See application file for complete search history.

(56) References Cited

U.S. PATENT DOCUMENTS 4,884,026 A 11/1989 Hayakawa et al.
5,063,113 A * 11/1991 Wada ............................ 428/446
(Continued)

FOREIGN PATENT DOCUMENTS

CN 1917231 A 2/2007
CN 101137912 A 3/2008
(Continued)

OTHER PUBLICATIONS

International Search Report dated Oct. 26, 2010 in International Application No. PCT/JP2010/004539 (with translation).
(Continued)

*Primary Examiner* — Matthew W Such
*Assistant Examiner* — Samuel Lair
(74) *Attorney, Agent, or Firm* — Oliff PLC

(57) ABSTRACT

To provide an epitaxial substrate for electronic devices, in which current flows in a lateral direction, which enables accurate measurement of the sheet resistance of HEMTs without contact, and to provide a method of efficiently producing the epitaxial substrate for electronic devices, the method characteristically includes the steps of forming a barrier layer against impurity diffusion on one surface of a high-resistance Si-single crystal substrate, forming a buffer as an insulating layer on the other surface of the high-resistance Si-single crystal substrate, producing an epitaxial substrate by epitaxially growing a plurality of III-nitride layers on the buffer to form a main laminate, and measuring resistance of the main laminate of the epitaxial substrate without contact.

9 Claims, 4 Drawing Sheets

(56) References Cited

U.S. PATENT DOCUMENTS

| | | | |
|---|---|---|---|
| 5,758,308 A * | 5/1998 | Maki et al. | 701/104 |
| 5,789,308 A * | 8/1998 | DeBusk et al. | 438/476 |
| 5,933,705 A * | 8/1999 | Geels et al. | 438/26 |
| 6,744,796 B1 * | 6/2004 | Chakrabarti | 372/43.01 |
| 7,119,487 B2 * | 10/2006 | Ikeda | 313/498 |
| 7,247,889 B2 | 7/2007 | Hanson et al. | |
| 7,821,279 B2 * | 10/2010 | Kato et al. | 438/14 |
| 7,923,753 B2 * | 4/2011 | Mita et al. | 257/192 |
| 7,994,573 B2 * | 8/2011 | Pan | 257/332 |
| 2004/0005777 A1 * | 1/2004 | Qu et al. | 438/689 |
| 2004/0029365 A1 * | 2/2004 | Linthicum et al. | 438/481 |
| 2005/0127477 A1 * | 6/2005 | Takase et al. | 257/550 |
| 2006/0118819 A1 | 6/2006 | Hanson et al. | |
| 2008/0190355 A1 * | 8/2008 | Chen et al. | 117/3 |

FOREIGN PATENT DOCUMENTS

| | | |
|---|---|---|
| JP | A-64-72079 | 3/1989 |
| JP | A-2001-185718 | 7/2001 |
| JP | A-2008-522447 | 6/2008 |
| WO | WO 2006095791 A1 * | 9/2006 |

OTHER PUBLICATIONS

May 31, 2013 Office Action issued in Korean Patent Application No. 10-2012-7003108 (with translation).

Jan. 17, 2014 Office Action issued in Chinese Patent Application No. 201080041478.9 (with English Translation).

* cited by examiner (a)

(b)

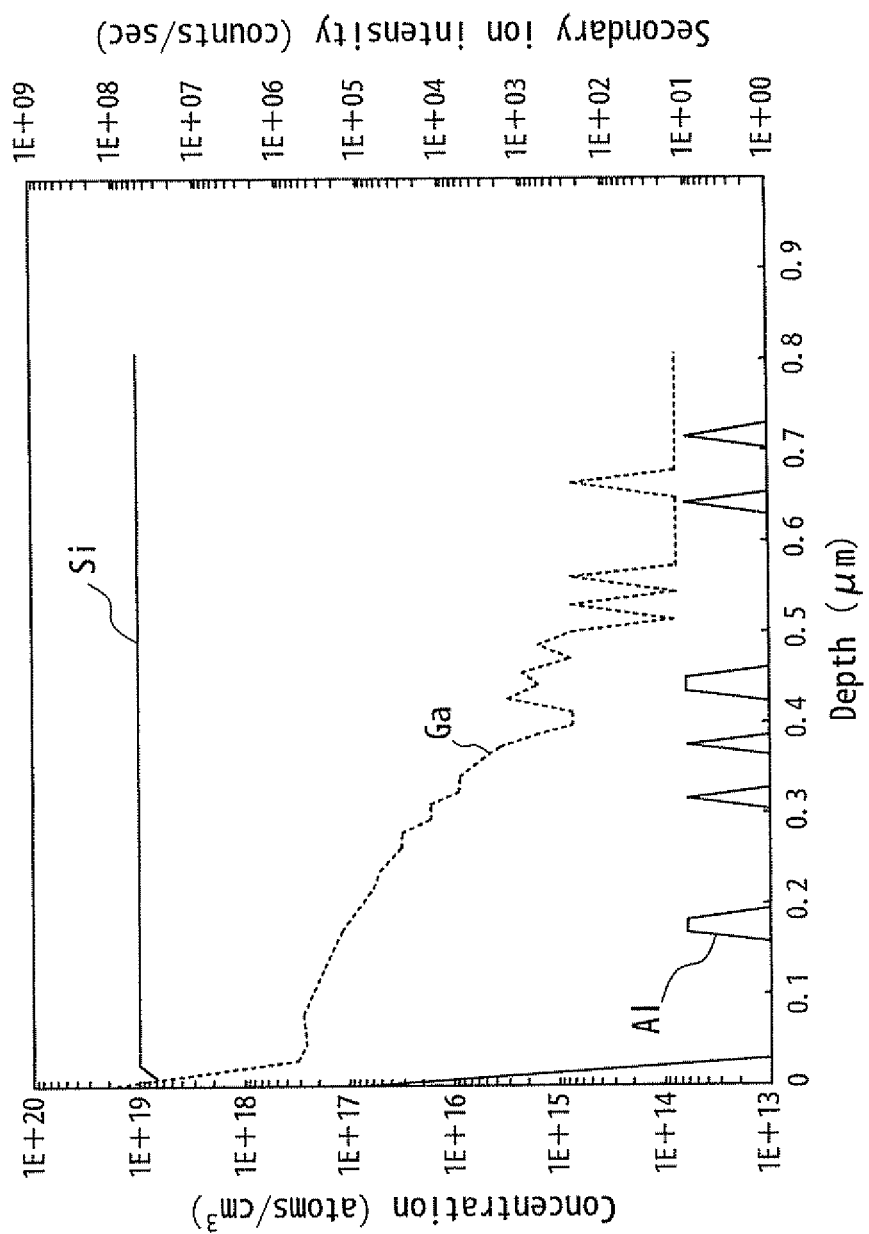

EPITAXIAL SUBSTRATE FOR ELECTRONIC DEVICE, IN WHICH CURRENT FLOWS IN LATERAL DIRECTION AND METHOD OF PRODUCING THE SAME

TECHNICAL FIELD

The present invention relates to an epitaxial substrate for electronic devices and a method of producing the same. The present invention specifically relates to an epitaxial substrate for HEMTs, in which current flows in a lateral direction, and a method of producing the same.

RELATED ART

In recent years, as speed required of IC devices and the like have increased, HEMTs (High electron mobility transistors) have been widely used as high-speed FETs (Field effect transistors). Such a field effect transistor is generally formed, as schematically illustrated in FIG. 1, for example by stacking a channel layer 22 and an electron supply layer 23 on an insulating substrate 21 and then providing a surface of the electron supply layer 23 with a source electrode 24, a drain electrode 25, and a gate electrode 26. When the device is operated, electrons move through the source electrode 24, the electron supply layer 23, the channel layer 22, the electron supply layer 23, and the drain electrode 25 in this order. In the device, a lateral direction is a main current flow direction. This movement of electrons in the lateral direction, i.e. the current flow direction, is controlled by the voltage applied to the gate electrode 26. In HEMTs, electrons generated at a joint interface between the electron supply layer 23 and the channel layer 22 which have band gaps different from each other can move significantly fast, as compared with electrons in normal semiconductors. Here, the movement of electrons, i.e. electric current in a lateral direction is controlled by the gate voltage; thus, various devices are operated.

JP2008-522447W discloses a structure in which a Si-single crystal substrate is used as an insulating substrate, and III-nitride layers are grown on the substrate. JP2008-522447W further describes a technique of preventing impurity contamination using the substrate having high resistance (resistivity over 100 Ω·cm) to reduce charge carriers and thereby reducing energy loss in a high-frequency region. However, when the III-nitride layer is grown on a surface of the high-resistance Si-single crystal substrate, the resistance of the rear surface of the high-resistance Si-single crystal substrate would become low. This phenomenon is due to the fact that in the epitaxial growth of the HI-nitride layer, III elements to be p-type carriers diffuse into the Si-single crystal substrate through the rear surface of the Si-single crystal substrate, which results in increase in the conductivity of the silicon substrate.

The sheet resistance of the channel layer 22, which is one of the characteristic property of HEMTs can be measured by a contact resistance measurement method or a non-contact resistance measurement method. Contact resistance measurement methods include Hall Effect measurement, in which an electrode is placed on the surface of the electron supply layer 23 side to measure the sheet resistance of the channel layer 22 at the center of a wafer. In this method, a buffer is provided between the channel layer 22 and the substrate 21, and this buffer is made to serve as an insulating layer, which enables measurement of the resistance of the channel layer 22 alone. However, this method is a destructive test in which the electrodes are attached on the surface; therefore, the wafer used in this measurement cannot be used any more.

On the other hand, as a non-contact resistance measurement method, a method of measuring the sheet resistance by an electromagnetic induction method is generally used. This method is a non-contact type; therefore, wafers used in the measurement are not wasted. Besides, the in-plane distribution in the very wafer used for actually fabricating a device can be measured. However, with respect to this method, in the case where a high-resistance Si-single crystal substrate is used and the resistance of the rear surface of the Si-single crystal substrate is reduced as described above, the resistance of the rear surface of the substrate is also included in the total sheet resistance; thus, the sheet resistance cannot be measured accurately.

In this regard, if a step of removing the rear surface of the Si substrate with reduced resistance is added, the above problem might be solved; however, increase in the number of process steps deteriorates workability.

PRIOR ART DOCUMENT

Patent Document

[Patent Document 1] JP 2008-522447 W

DISCLOSURE OF THE INVENTION

Problems to be Solved by the Invention

An object of the present invention is to provide an epitaxial substrate for electronic devices, in which current flows in a lateral direction, which enables accurate measurement of the sheet resistance of HEMTs without contact, and to provide a method of efficiently producing the epitaxial substrate for electronic devices.

Means for Solving the Problems

In order to achieve the above object, the present invention primarily includes the following constituent features.

(1) A method of producing an epitaxial substrate for electronic devices, comprising the steps of: forming a barrier layer against impurity diffusion on one surface of a high-resistance Si-single crystal substrate; forming a buffer as an insulating layer on the other surface of the high-resistance Si-single crystal substrate; producing an epitaxial substrate by epitaxially growing a plurality of III-nitride layers on the buffer to form a main laminate; and measuring resistance of the main laminate of the epitaxial substrate without contact, wherein a lateral direction is a current flow direction in the epitaxial substrate.

(2) The method of producing an epitaxial substrate for electronic devices according to (1), further comprising, after the step of producing the epitaxial substrate, a step of at least partially removing the barrier layer against impurity diffusion and the high-resistance Si-single crystal substrate, and a step of forming electrodes on the main laminate.

(3) The method of producing an epitaxial substrate for electronic devices according to (1) or (2), wherein the barrier layer against impurity diffusion is formed by thermally oxidizing the one surface.

(4) The method of producing an epitaxial substrate for electronic devices according to any one of (1) to (3), wherein the layers formed on the other surface side are formed by epitaxial growth using chemical vapor deposition.

(5) An epitaxial substrate for electronic devices, comprising: a high-resistance Si-single crystal substrate; a barrier layer against impurity diffusion formed on one surface of the high-resistance Si-single crystal substrate; a buffer as an insulating layer formed on the other surface of the high-resistance Si-single crystal substrate; and a main laminate formed by epitaxially growing a plurality of III-nitride layers on the buffer, wherein a lateral direction is a current flow direction, and in a region of the high-resistance Si-single crystal substrate from the one surface to a depth of 1 μm, III-element concentration is $1\times10^{16}$ atoms/cm$^3$ or less.

(6) The epitaxial substrate for electronic devices according to (5), wherein the barrier layer against impurity diffusion is formed of an oxide, a nitride, or a carbide of Si.

(7) The epitaxial substrate for electronic devices according to (5) or (6), wherein the buffer has a superlattice structure or a graded composition structure.

(8) The epitaxial substrate for electronic devices according to any one of (5) to (7), wherein the buffer has a C concentration of $1\times10^{18}$ atoms/cm$^3$ or more.

(9) The epitaxial substrate for electronic devices according to any one of (5) to (8), wherein the high-resistance Si-single crystal substrate has a resistivity of 5000 Ω·cm or more.

Effect of the Invention

An epitaxial substrate for electronic devices of the present invention is provided with a barrier layer against impurity diffusion on one surface of a high-resistance Si-single crystal substrate, so that the sheet resistance can be measured accurately without contact.

Further, according to a method of producing an epitaxial substrate for electronic devices in accordance with the present invention, a barrier layer against impurity diffusion is formed on one surface of a high-resistance Si-single crystal substrate; thus, an epitaxial substrate for electronic devices which enables accurate measurement of the sheet resistance without contact can be produced efficiently.

BRIEF DESCRIPTION OF DRAWINGS

FIG. 3(a) illustrates an invention example while FIG. 3(b) illustrates a comparative example.

FIG. 4 is a diagram showing a measurement result of performing component analysis on a Si-single crystal substrate in the depth direction from its rear surface (one of the surfaces) by SIMS (Secondary Ion Mass Spectrometry) in a case where a barrier layer against impurity diffusion is not formed.

MODES FOR CARRYING OUT THE INVENTION

Figure 2:
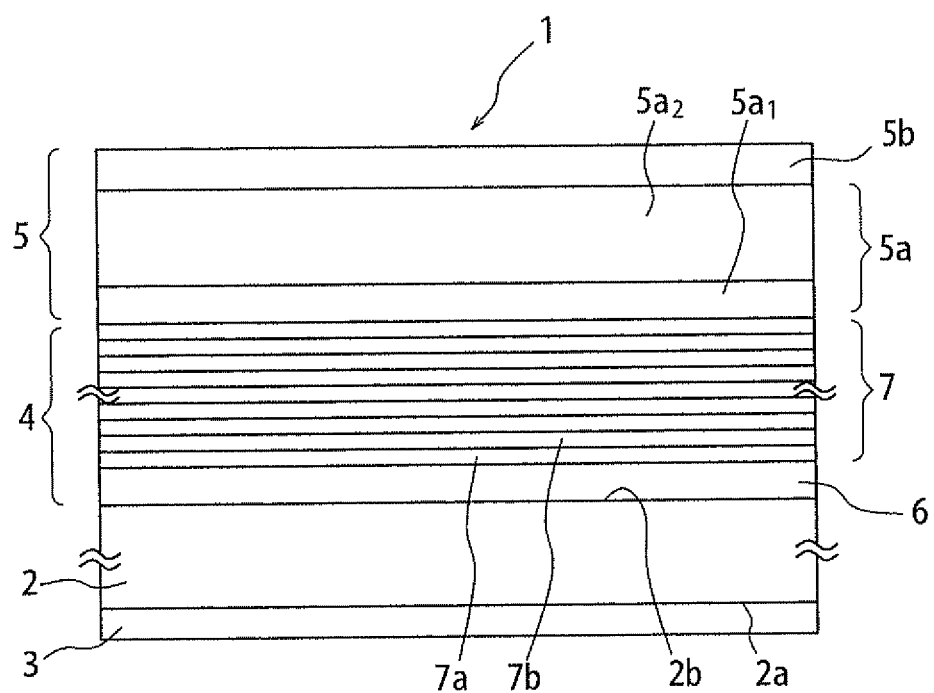
FIG. 2 is a schematic cross-sectional view of an epitaxial substrate for electronic devices according to the present invention.

Next, an embodiment of an epitaxial substrate for electronic devices according to the present invention will be described with reference to the drawings. FIG. 2 schematically shows a cross-section structure of an epitaxial substrate for electronic devices according to the present invention. Note that the epitaxial substrate in FIG. 2 is enlarged in the thickness direction for the sake of explanation.

An epitaxial substrate 1 for electronic devices according to the present invention has the following characteristic features. A lateral direction is a current flow direction. As shown in FIG. 2, the epitaxial substrate 1 includes a high-resistance Si-single crystal substrate 2, a barrier layer against impurity diffusion 3 formed on one surface 2a of the high-resistance Si-single crystal substrate 2, a buffer 4 as an insulating layer formed on the other surface 2b of the high-resistance Si-single crystal substrate 2, and a main laminate 5 formed by epitaxially growing a plurality of III-nitride layers on this buffer 4. In a region from the one surface 2a of the high-resistance Si-single crystal substrate 2 to a depth of 1 μm, the III-element concentration is $1\times10^{16}$ atoms/cm$^3$ or less. With such a structure, the sheet resistance of HEMTs can be measured accurately without contact.

Figure 1:
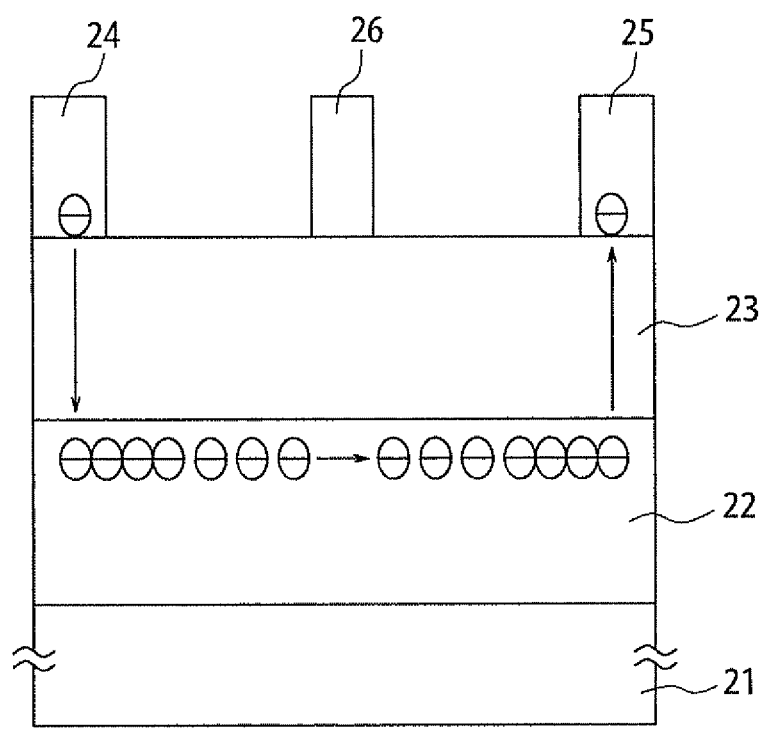
FIG. 1 is a schematic cross-sectional view illustrating a typical field effect transistor.

Now, "a lateral direction is a current flow direction" refers to a state where, as illustrated in FIG. 1, electric current flows from the source electrode 24 to the drain electrode 25, mainly in the width direction of the laminate. This state is different from, for example, the state where electric current flows mainly in the vertical direction, that is, the direction of the thickness of the laminate as in a structure in which a semiconductor is sandwiched between a pair of electrodes.

The crystal plane of the high-resistance Si-single crystal substrate 2 is not limited in particular, and (111), (100), (110) planes and the like can be used. However, to grow the (0001) plane of a Group III nitride with good surface flatness, the (111) plane is desirably used. In addition, the conductivity type may be either p-type or n-type.

The high-resistance Si-single crystal substrate 2 preferably has a resistivity of 5000 Ω·cm or more, and with high resistivity, an epitaxial substrate for electronic devices excellent in high frequency characteristics can be produced. Further, such a substrate is preferably produced by FZ method which makes it easy to purify Si crystals. Using a high resistance substrate, a depletion layer can be effectively expanded, and loss in operating an electronic device with high frequency due to capacitive or inductive coupling between carriers formed on a substrate surface and the electric charges in the substrate can be suppressed. Note that when a low resistance substrate is used, the problem of reduced resistance, which the present invention tries to resolve, does not arise; therefore, the substrate of the present invention is limited to high resistance substrates.

The barrier layer against impurity diffusion 3 not only protects the rear surface of the Si-single crystal substrate but also prevents III elements to be p-type carriers reaching to the rear surface of the Si-single crystal substrate from diffusing into the substrate, thereby preventing increase in conductivity of the Si-single crystal substrate. Thus, the region of the high-resistance Si-single crystal substrate 2 from one surface 2a to a depth of 1 μm can have a III-element concentration of $1\times10^{16}$ atoms/cm$^3$ or less. Such an impurity level allows the rear surface of the Si-single crystal substrate to have a sheet resistance of 10000 Ω/square or more. Further since III element serves as p-type impurities in the Si-single crystal substrate 2, the above concentration range can suppress loss in operating an electronic device with high frequency due to capacitive or inductive coupling between the electrodes formed on a substrate surface and p-type impurities in the substrate. Note that the impurity concentration is measured by SIMS analysis. In this case, the impurity concentration profile of the substrate in the depth direction from the rear surface is measured. On this occasion, the Al impurity concentration is preferably lower than the Ga impurity concentration. This is because Al has lower activation energy than Ga, so Al easily generates p-type carriers. Note that the barrier layer against impurity diffusion 3 may be formed of, for example, oxides, nitrides, and carbides of Si or the like, and its thickness is preferably 0.1 μm or more. If the thickness is less than 0.1 μm, the function of a barrier layer against impurity diffusion would not be sufficiently achieved. The upper limit of the thickness is not limited in particular; however, considering increase in the process time due to the production of the barrier layer against impurity diffusion, the thickness is preferably 10 μm or less. The thickness of the barrier layer against impurity diffusion here refers to the thickness thereof immediately before a step of producing the epitaxial substrate by epitaxial growth. This is because it should be taken into account, for example, that the barrier layer against impurity diffusion is etched in the substrate cleaning.

The buffer 4 preferably has a superlattice structure or a graded composition structure. The superlattice structure refers to a structure in which first layers 7a and second layers 7b are stacked in a cyclic manner as shown in FIG. 2. The structure may include layers other than the first layers 7a and the second layers 7b (for example, a compositional transition layer). Meanwhile, the graded composition structure refers to a structure in which the content of certain III element is graded in the film thickness direction.

Further, the buffer 4 preferably includes an initial growth layer 6 in contact with the Si-single crystal substrate 2 and a superlattice laminate 7 having a superlattice laminate structure on the initial growth layer 6 as shown in FIG. 2. The initial growth layer 6 is formed of, for example, an AlN material, and when the initial growth layer 6 is formed of AlN, the reaction with the Si-single crystal substrate 2 can be suppressed, which makes it possible to improve vertical breakdown voltage. The aim of this is to suppress degradation of vertical breakdown voltage due to defects generated by the reaction of Ga and In with Si in the substrate when the initial growth layer 6 is formed of III-nitride materials containing Ga and In, which induce through-hole defects in the epitaxial film. Note that the AlN materials here may contain a minute amount of impurities of 1% or less, for example, impurities such as Ga and In above, or Si, H, O, C, B, Mg, As, or P.

The buffer 4 preferably has a C concentration of $1 \times 10^{18}$ atoms/cm$^3$ or more to improve vertical breakdown voltage. When the buffer 4 has low resistance, an adverse effect similar to the reduced resistance of the rear surface of the substrate as described above is a concern.

Further, the epitaxial substrate 1 for electronic devices of the present invention desirably has the maximum concentration of the total III-atoms of $1 \times 10^{16}$ atoms/cm$^3$ or less in a region of the high-resistance Si-single crystal substrate 2 from the surface of the initial growth layer 6 side to a depth of 0.1 μm, and the concentration of the total III-atoms of $1 \times 10^{15}$ atoms/cm$^3$ or less in a region from the surface of the initial growth layer 6 side to a depth of 0.3 μm. When III atoms of more than the predetermined amount are in these regions, the these regions also becomes less resistant, which would cause mismeasurement in the sheet resistance measurement.

The epitaxial substrate 1 for electronic devices is preferably used for HEMTs. The main laminate 5 of the epitaxial substrate 1 for electronic devices shown in FIG. 2 may have a channel layer 5a made of a $B_{a1}Al_{b1}Ga_{c1}In_{d1}N$ ($0 \le a_1 \le 1$, $0 \le b_1 \le 1$, $0 \le c_1 \le 1$, $0 \le d_1 \le 1$, $a_1+b_1+c_1+d_1=1$) material and an electron supply layer 5b made of a $B_{a2}Al_{b2}Ga_{c2}In_{d2}N$ ($0 \le a_2 \le 1$, $0 \le b_2 \le 1$, $0 \le c_2 \le 1$, $0 \le d_2 \le 1$, $a_2+b_2+c_2+d_2=1$) material, which has a larger band gap than the channel layer 5a. On this occasion, each layer can be made of a single or a plurality of compositions. In particular, to prevent alloy scattering and to lower resistivity at the current flowing portion, at least a portion of the channel layer 5a which is in contact with the electron supply layer 5b is preferably made of a GaN material.

Next, an embodiment of a method of producing an epitaxial substrate for electronic devices according to the present invention will be described with reference to the drawings.

An epitaxial substrate 1 for electronic devices of the present invention can be produced efficiently by the steps of forming an barrier layer against impurity diffusion 3 on one surface 2a of a high-resistance Si-single crystal substrate 2, forming a buffer 4 as an insulating layer on the other surface 2b of this high-resistance Si-single crystal substrate 2, producing an epitaxial substrate by epitaxially growing a plurality of III-nitride layers on this buffer 4 to form a main laminate 5, and measuring the resistance of the main laminate 5 of the epitaxial substrate without contact. With such a structure, the sheet resistance can be accurately measured without contact.

Further, after the step of forming the main laminate 5, a step of at least partially removing the barrier layer against impurity diffusion 3 and the high-resistance Si-single crystal substrate 2 and a step of forming electrodes on the main laminate 5 may be added.

The barrier layer against impurity diffusion 3 may be attached to the surface 2a or may be formed on the surface 2a by vapor deposition using CVD, sputtering, or the like. More preferably, the barrier layer against impurity diffusion 3 is formed by thermal oxidation which allows the formation of a highly resistant, dense, and etching resistant layer.

The layers formed on the other surface 2b side are preferably formed by epitaxial growth using chemical vapor deposition. MOCVD may be used for the growth method; TMA (trimethylaluminum), TMG (trimethylgallium), or the like may be used as a III-material; ammonia or the like may be used as a V-material; and hydrogen gas and nitrogen gas or the like may be used as a carrier gas.

FIG. 1 and FIG. 2 merely show examples of representative embodiments, and the present invention is not limited to these embodiments. For example, interlayers may be inserted or another superlattice layer may be interposed between each layer, or the compositions of the layers may be graded as long as the effects of the present invention are not adversely affected.

EXAMPLE

Example 1

As shown in FIG. 2, a high-resistance Si-single crystal substrate 2 was thermally oxidized to form SiO$_x$ films on the both surfaces of the substrate, and a SiO$_x$ film on one side was then removed to form a 3-inch (111) Si-single crystal substrate 2 (thickness: 600 μm, resistivity: $6 \times 10^3$ Ω·cm) having a SiO$_x$ layer 3 (thickness: 2 μm) on its rear surface 2a (one surface). On a surface 2b (the other surface) of the Si-single crystal substrate 2, an initial growth layer 6 (AN material, thickness: 100 nm), and a superlattice laminate 7 (AlN, thickness: 4 nm and Al$_{0.15}$Ga$_{0.85}$N, thickness: 25 nm, total 75 layers) were grown to form a buffer 4. On this superlattice laminate 7, a channel layer 5a (GaN material, thickness: 0.75 μm) and an electron supply layer 5b (Al$_{0.15}$Ga$_{0.85}$N material, thickness: 40 nm) were epitaxially grown to form a main laminate 5 having a HEMT structure. Thus, a sample was obtained. The C concentration of the superlattice laminate 7 was $2.0 \times 10^{18}$ atoms/cm$^3$. Further, a portion 5a$_2$ of the channel layer 5a on the electron supply layer side had a C concentration of $0.8 \times 10^{16}$ atoms/cm$^3$ to $1.5 \times 10^{16}$ atoms/cm$^3$. The growth temperature and growth pressure of each layer are shown in Table 1. MOCVD was used as a growth method. TMA (trimethylaluminium) and TMG (trimethylgallium) were used as Group III materials, and ammonia was used as a Group V material. Hydrogen gas and nitrogen gas were used as carrier gases. The deposition temperature here means a temperature of the substrate itself, measured using a radiation thermometer during the growth. Note that the SIMS measurement of the C concentration was performed by etching from the epitaxial layer side using a measuring apparatus manufactured by Camera using Cs⁻ as an ion source at an ion energy of 8 keV.

Figure 3:
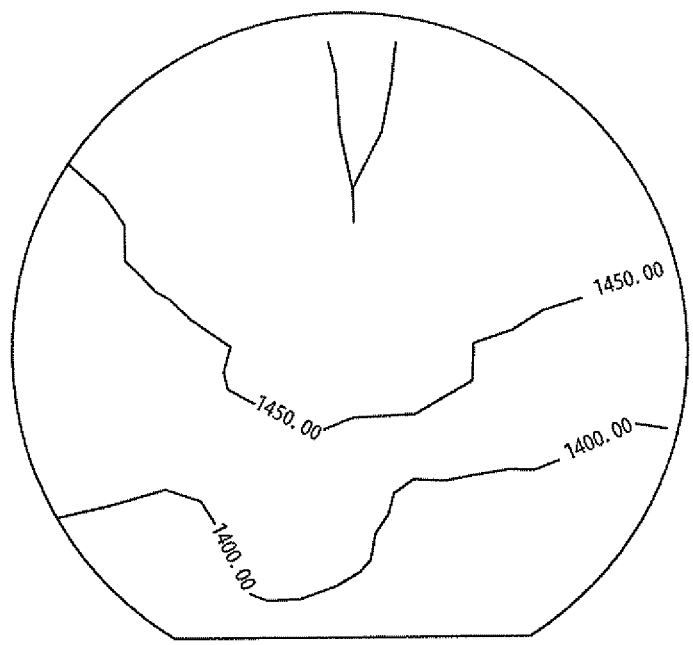
FIGS. 3(a) and 3(b) show results of measuring the in-plane distribution of sheet resistance using a non-contact resistance measuring apparatus.
Figure 3:
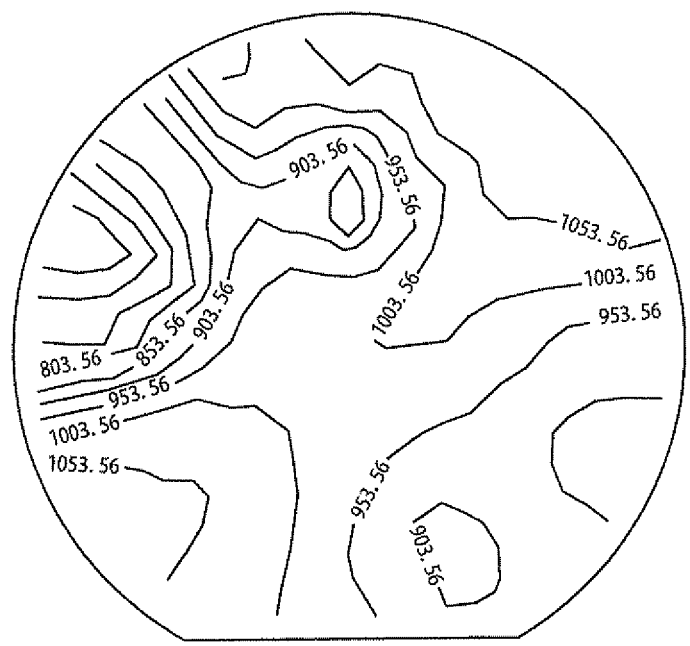

In-plane distribution of the sheet resistance was measured with a non-contact resistance measuring apparatus using an electromagnetic induction method (manufactured by Lehighton Electronics, inc) to obtain a profile shown in FIG. 3($a$). The standard deviation ($\sigma$ value) of the sheet resistance distribution was 2.6%.

As electrical characteristics of the channel layer portion in the epitaxial substrate were measured by Hall effect measurement, the sheet resistance at the center of the wafer was 1410 Ω/square which was different from the above non-contact measurement value (1450 Ω/square) by 40 Ω/square.

As the Hall effect measurement was performed on the rear surface of the Si-single crystal substrate at the center of the wafer, the sheet resistance was 100 kΩ/square or more which is over the detection limit of the measurement apparatus.

After the $SiO_x$ film on the rear surface of the Si-single crystal substrate of the above sample was removed by a hydrofluoric acid aqueous solution, impurity concentration of the rear surface of the Si-single crystal substrate (wafer center) in a region of the Si-single crystal substrate from the rear surface to a depth of 1 μm was measured by SIMS. The concentration of III-element impurities such as Ga and Al in the whole measured region was less than $1 \times 10^{16}$ atoms/cm³.

TABLE 1

|  | Growth pressure (kPa) | Growth temperature (° C.) |
|---|---|---|
| Initial growth layer 6 | 10 | 1005 |
| Superlattice laminate 7 | 10 | 1005 |
| Channel layer on the buffer side $5a_1$ | 10 | 1015 |
| Channel layer on the electron supply layer side $5a_2$ | 100 | 1025 |
| Electron supply layer 5b | 10 | 1025 |

Comparative Example 1

A structure similar to the structure in Example I was formed on a 4-inch (111) Si-single crystal substrate (thickness: 600 μm, resistivity: $6 \times 10^3$ Ω·cm) without a $SiO_x$ layer on its rear surface under the same conditions as Example 1. Thus, a sample was obtained.

In-plane distribution of the sheet resistance was measured with a non-contact resistance measuring apparatus using an electromagnetic induction method (manufactured by Lehighton Electronics, inc) to show a profile shown in FIG. 3($b$). The $\sigma$ value of the sheet resistance distribution was 10.1%.

As electrical characteristics of the channel layer portion in the epitaxial substrate were measured by Hall effect measurement, the sheet resistance at the center of the wafer was 1410 Ω/square which was different from the above non-contact measurement value (1000 Ω/square) by 410 Ω/square.

As the Hall effect measurement was performed on the rear surface of the Si-single crystal substrate at the center of the wafer, the sheet resistance was 3 kΩ/square.

As the impurities in the rear surface of the Si-single crystal substrate (wafer center) were observed using SIMS, the concentration of Ga was found to exceed the detection limit (FIG. 4). Note that when the rear surface of the sample of Comparative Example 1 was ground by 1 μm, the sheet resistance at the wafer center measured using the non-contact resistance measuring apparatus was 1450 Ω/square, almost the same sheet resistance as Example 1.

Example 2

A high-resistance Si-single crystal substrate 2 was thermally oxidized to form $SiO_x$ films on its both surfaces, and a $SiO_x$ film on one side was then removed to form a 3-inch (111) Si-single crystal substrate 2 (thickness: 600 μm, resistivity: $6 \times 10^3$ Ω·cm) having a $SiO_x$ layer 3 on its rear surface 2$a$. On a surface 2$b$ (the other surface) of the Si-single crystal substrate 2, an initial growth layer 6 (AlN material, thickness: 100 nm), an $Al_{0.6}Ga_{0.4}N$ layer (thickness: 0.2 μm), and an $Al_{0.3}Ga_{0.7}N$ layer (thickness: 0.2 μm) were sequentially grown to form a buffer 4. On this graded composition buffer layer, a channel layer 5$a$ (GaN material, thickness: 0.75 μm) and an electron supply layer 5$b$ ($Al_{0.15}Ga_{0.85}N$ material, thickness: 40 nm) were epitaxially grown to form a main laminate 5 having a HEMT structure. Thus, a sample was obtained. The C concentration of the AlGaN layer was $2.0 \times 10^{18}$ atoms/cm³. Further, a portion 5$b$ of the channel layer on the electron supply layer side had a C concentration of $0.8 \times 10^{16}$ atoms/cm³ to $1.5 \times 10^{16}$ atoms/cm³. The growth temperature and growth pressure of each layer are shown in Table 2. MOCVD was used as a growth method. TMA (trimethylaluminium) and TMG (trimethylgallium) were used as Group III materials, and ammonia was used as a Group V material. Hydrogen gas and nitrogen gas were used as carrier gases. The deposition temperature here means a temperature of the substrate itself, measured using a radiation thermometer during the growth. Note that the SIMS measurement of the C concentration was performed by etching from the epitaxial layer side using a measuring apparatus manufactured by Cameca using Cs⁻ as an ion source at an ion energy of 8 keV.

In-plane distribution of the sheet resistance was measured with a non-contact resistance measuring apparatus using an electromagnetic induction method (manufactured by Lehighton Electronics, inc). The $\sigma$ value of the sheet resistance distribution was 2.0%.

As electrical characteristics of the channel layer portion in the epitaxial substrate were measured by Hall effect measurement, the sheet resistance at the center of the wafer was 1400 Ω/square which was different from the above non-contact measurement value (1450 Ω/square) by 50 Ω/square.

As the Hall effect measurement was performed on the rear surface of the Si-single crystal substrate at the center of the wafer, the sheet resistance was 100 kΩ/square or more which is over the detection limit of the measurement apparatus.

TABLE 2

|  | Growth pressure (kPa) | Growth temperature (° C.) |
|---|---|---|
| Initial growth layer 6 | 10 | 1005 |
| $Al_{0.6}Ga_{0.4}N$ layer | 10 | 1005 |
| $Al_{0.3}Ga_{0.7}N$ layer | 10 | 1005 |
| Channel layer on the buffer side $5a_1$ | 10 | 1015 |
| Channel layer on the electron supply layer side $5a_2$ | 100 | 1025 |
| Electron supply layer 5b | 10 | 1025 |

Comparative Example 2

A structure similar to the structure in Example 2 was formed on a 4-inch (111) Si-single crystal substrate (thickness: 600 μm, resistivity: $6 \times 10^3$ Ω·cm) without a SiO$_x$ layer on its rear surface under the same conditions as Example 2. Thus, a sample was obtained.

In-plane distribution of the sheet resistance was measured with a non-contact resistance measuring apparatus using an electromagnetic induction method (manufactured by Lehighton Electronics, inc). The σ value of the sheet resistance distribution was 12.5%.

As electrical characteristics of the channel layer portion in the epitaxial substrate were measured by Hall effect measurement, the sheet resistance at the center of the wafer was 1400 Ω/square which was different from the above non-contact measurement value (800 Ω/square) by 600 Ω/square.

As the Hall effect measurement was performed on the rear surface of the Si-single crystal substrate at the center of the wafer, the sheet resistance was 1.9 KΩ/square.

As shown in Table 3, with respect to Examples 1 and 2, reduction in the resistance of the rear surface was suppressed, difference between the sheet resistance measured by a non-contact method and the sheet resistance measured by a contact method was small, and the sheet resistance distribution was less varied, as compared with Comparative Examples 1 and 2.

TABLE 3

| | Non-contact measurement | | Contact measurement | | |
|---|---|---|---|---|---|
| | Sheet resistance A (Ω/square) | Sheet resistance distribution σ value (%) | Sheet resistance B (Ω/square) | Resistance of the rear surface (kΩ/square) | A − B (Ω/square) |
| Example 1 | 1450 | 2.6 | 1410 | 100 or more | +40 |
| Comparative Example 1 | 1000 | 10.1 | 1410 | 3 | −410 |
| Example 2 | 1450 | 2.0 | 1400 | 100 or more | +50 |
| Comparative Example 2 | 800 | 12.5 | 1400 | 1.9 | −600 |

INDUSTRIAL APPLICABILITY

According to the present invention, one surface of a high-resistance Si-single crystal substrate is provided with a barrier layer against impurity diffusion, so that an epitaxial substrate for electronic devices which allows the sheet resistance to be measured accurately without contact can be provided.

Further, according to a method of producing an epitaxial substrate for electronic devices of the present invention, a barrier layer against impurity diffusion is formed on one surface of a high-resistance Si-single crystal substrate, so that an epitaxial substrate for electronic devices of the present invention of which the sheet resistance can be measured accurately without contact can be produced efficiently.

REFERENCE NUMERALS

1: Epitaxial substrate for electronic devices
2: High-resistance Si-single crystal substrate
2a: One surface
2b: The other surface
3: Barrier layer against impurity diffusion
4: Buffer
5: Main laminate
5a: Channel layer
5b: Electron supply layer
6: Initial growth layer
7: Superlattice laminate
7a: First layer
7b: Second layer

What is claimed is:

1. A method of producing an epitaxial substrate for electronic devices, comprising the steps of:
    forming a barrier layer against impurity diffusion on one surface of a high-resistance Si-single crystal substrate;
    forming a buffer as an insulating layer on the other surface of the high-resistance Si-single crystal substrate;
    producing an epitaxial substrate by epitaxially growing a plurality of III-nitride layers on the buffer to form a main laminate; and
    measuring resistance of the main laminate of the epitaxial substrate without contact,
    wherein the barrier layer against impurity diffusion prevents III elements from diffusing into the high-resistance Si-single crystal substrate from the one surface of the high-resistance Si-single crystal substrate during epitaxially growing the plurality of III group nitride layers, and
    wherein a lateral direction is a current flow direction in the epitaxial substrate.

2. The method of producing an epitaxial substrate for electronic devices according to claim 1, further comprising, after the step of producing the epitaxial substrate,
    a step of at least partially removing the barrier layer against impurity diffusion and the high-resistance Si-single crystal substrate, and
    a step of forming electrodes on the main laminate.

3. The method of producing an epitaxial substrate for electronic devices according to claim 1, wherein the barrier layer against impurity diffusion is formed by thermally oxidizing the one surface.

4. The method of producing an epitaxial substrate for electronic devices according to claim 1, wherein the layers formed on the other surface side are formed by epitaxial growth using chemical vapor deposition.

5. An epitaxial substrate for electronic devices, comprising:
    a high-resistance Si-single crystal substrate;
    a barrier layer against impurity diffusion formed on one surface of the high-resistance Si-single crystal substrate;
    a buffer as an insulating layer formed on the other surface of the high-resistance Si-single crystal substrate; and
    a main laminate formed by epitaxially growing a plurality of III-nitride layers on the buffer,
    wherein the barrier layer against impurity diffusion prevents III elements from diffusing into the high-resistance Si-single crystal substrate from the one surface of the high-resistance Si-single crystal substrate during epitaxially growing the plurality of III group nitride layers, and
    wherein a lateral direction is a current flow direction, and in a region of the high-resistance Si-single crystal substrate from the one surface to a depth of 1 μm, III-element concentration is $1 \times 10^{16}$ atoms/cm$^3$ or less.

6. The epitaxial substrate for electronic devices according to claim 5,
    wherein the barrier layer against impurity diffusion is formed of an oxide, a nitride, or a carbide of Si.

7. The epitaxial substrate for electronic devices according to claim 5,
    wherein the buffer has a superlattice structure or a graded composition structure.

8. The epitaxial substrate for electronic devices according to claim 5,
wherein the buffer has a C concentration of $1\times10^{18}$ atoms/cm$^3$ or more.

9. The epitaxial substrate for electronic devices according to claim 5,
wherein the high-resistance Si-single crystal substrate has a resistivity of 5000 Ω·cm or more.

* * * * *